United States Patent
Subrahmanyan et al.

(10) Patent No.: US 8,108,453 B2
(45) Date of Patent: Jan. 31, 2012

(54) SYSTEM AND METHOD FOR FILTER RESPONSE SWITCHING

(75) Inventors: Ravi Subrahmanyan, Windham, NH (US); Sanitha Dinasarapu, Andover, MA (US)

(73) Assignee: Applied Micro Circuits Corporation, San Diego, CA (US)

( * ) Notice: Subject to any disclaimer, the term of this patent is extended or adjusted under 35 U.S.C. 154(b) by 1078 days.

(21) Appl. No.: 11/958,220

(22) Filed: Dec. 17, 2007

(65) Prior Publication Data

US 2009/0154622 A1 Jun. 18, 2009

(51) Int. Cl.
*G06F 7/10* (2006.01)
*G06F 1/02* (2006.01)
(52) U.S. Cl. ........................................ 708/322; 708/271
(58) Field of Classification Search .................. 375/350, 375/376, 375; 708/300, 819, 311, 271, 322, 708/323
See application file for complete search history.

(56) References Cited

U.S. PATENT DOCUMENTS

| | | | | |
|---|---|---|---|---|
| 4,752,748 | A | * | 6/1988 | Grzeszykowski ............ 331/1 A |
| 4,928,075 | A | * | 5/1990 | Leis ................................ 331/17 |
| 5,146,187 | A | * | 9/1992 | Vandegraaf ..................... 331/17 |
| 6,696,886 | B1 | * | 2/2004 | Ke et al. ......................... 327/553 |
| 7,042,972 | B2 | * | 5/2006 | Fahim ............................ 375/376 |
| 7,498,890 | B2 | * | 3/2009 | Wallberg et al. ................ 331/17 |
| 2008/0129352 | A1 | * | 6/2008 | Zhang ............................ 327/157 |

* cited by examiner

*Primary Examiner* — Chuong D Ngo
(74) *Attorney, Agent, or Firm* — Law Office of Gerald Maliszewski; Gerald Maliszewski

(57) ABSTRACT

A system and method are provided for efficiently switching a loop bandwidth using stored values in a digital filter of a phase-locked loop system. In a first timeslice, an input signal is digitally filtered using base coefficients multiplied by stored filter output and input values from previous timeslices. The filter output value is used to acquire the input signal frequency in a first bandwidth. In response to changes in the input signal frequency, the input signal is digitally filtered in a predetermined number of first intermediate period timeslices using transient coefficients multiplied by stored filter output and input values from previous timeslices. As a result, the first filter output value is maintained within a predetermined range. In a second timeslice, the input signal is digitally filtered using base coefficients multiplied by stored filter output and input values from previous timeslices to acquire the input signal frequency in a second bandwidth.

21 Claims, 9 Drawing Sheets

SYSTEM AND METHOD FOR FILTER RESPONSE SWITCHING

BACKGROUND OF THE INVENTION

1. Field of the Invention

This invention generally relates to digital filtering and, more particularly, to a system and method for using a digital filter to enable an efficient switching response.

2. Description of the Related Art

A phase-locked loop (PLL) is often used as a phase conditioning circuit for mapping time domain multiplexed (TDM) signals. The PLL is used to attenuate phase variations between the input and output data streams to within acceptable (i.e., standardized) levels. Due to the stringent requirements on phase control, the bandwidth of such a PLL is usually very low, typically well below 1 Hz. While this narrow bandwidth is preferred for normal operation, it can be a problem if there is a change in the data rate, as can occur when there is a disruption in the network, a reorganization of the network, or during entry into and exit from alarm conditions. During these times there are other, competing demands that require the circuits to react within a short time. The PLL must detect condition changes and modify its behavior to lock on to the changed rate quickly, which requires a wide bandwidth. Once acquired, the PLL must attenuate the phase variations with the low bandwidth.

One specific application of the above-mentioned PLL involves timing transport over packet networks. Due to the large phase variations that may occur in packet networks, these PLLs must have ultra-low bandwidths in order to adequately regulate the recovered timing. As a consequence, the loop can take a very long time (from hours to days) to respond to rate changes. An alternate mechanism is therefore required to reduce this acquisition time, while still maintaining the behavior which conditions phase variation. Various mechanisms have been designed, and they usually involve changing the bandwidth of the filter in response to detecting a change in operating conditions.

FIG. 1 is a schematic block diagram depicting a phase conditioning circuit used for mapping (prior art). Incoming data goes into a buffer 10, and is read out by a rate generator 12, usually contained in a mapping circuit (not shown). The instantaneous buffer fill is sent to a filter 14, which sets the rate at which the rate generator reads out the data. These elements form a loop that serves to regulate the outgoing data rate.

FIG. 2 is a diagram depicting the buffer fill variation as a function of time when the loop is in a locked state (prior art). When the loop is locked, the output data rate is equal to the average input rate, such that the buffer 10 stays approximately half-full. Due to network impairments, the rate of the incoming data is not constant, but varies about its putative value. Therefore, instantaneously, the incoming rate is sometimes higher than its nominal rate and sometimes lower than its nominal rate. As a result, if the output rate is at the nominal value (as recovered by the loop), then the buffer fill has some variation, the average value of which is zero. So, the buffer is roughly centered, but can vary about the center value by the amount of the variation in the incoming and outgoing rates.

The maximum allowed variation in the incoming data rate is constrained by the communications standards. The high frequency variation is called jitter, and is usually of small magnitude. The low frequency variation is called wander, and can be of high magnitude. The wander typically has to be carefully controlled in order to prevent buffer overflows or underflows.

FIG. 3 is a diagram depicting buffer fill as a function of time when there is a change in the incoming data rate (prior art). When there is a change in the incoming rate, the buffer starts to fill (or empty), as shown. A non-temporary variation (e.g., a new data rate) must be distinguished from wander. Variations due to wander can be controlled by adjusting the rate of the outgoing data, while a new rate has an average trend that will either fill or empty the buffer.

Therefore, multi-speed loops and circuitry capable of detecting changes in incoming data rates are a conventional solution to the above-mentioned PLL issues. The trade-offs between underdamped and overdamped loops are well known in the art, and each condition is associated with a different set of problems. Further, in the case of a loop using a digital filter, the calculations required during these bandwidth transitions are very intensive, and in some cases, may lead to a loss of lock.

It would be advantageous if a digital filter response could be efficiently switched, without changing the filter design, but using a special set of non-calculation-intensive transient coefficients.

SUMMARY OF THE INVENTION

As noted above, a PLL is often used as a phase conditioning circuit for mapping TDM signals. Such a PLL must have a sufficiently low bandwidth to adequately attenuate phase variations, but must also respond fast to changes in traffic conditions. The present invention describes a system and method that enables a very low bandwidth PLL that can also quickly acquire a rate change. The system and method are particularly advantageous for high-density multichannel applications in which a common core processes many channels.

Accordingly, a method is provided for efficiently switching a loop bandwidth using stored values in a digital filter of a PLL system. The method accepts an input signal. In a first timeslice, the input signal is digitally filtered using base coefficients multiplied by stored filter output and input values from previous timeslices. As a result, a first filter output value is used to acquire the input signal frequency in a first bandwidth. In response to changes in the input signal frequency, the input signal is digitally filtered in a predetermined number of first intermediate period timeslices using transient coefficients multiplied by stored filter output and input values from previous timeslices. As a result, the first filter output value is maintained within a predetermined range. In a second timeslice, the input signal is digitally filtered using base coefficients multiplied by stored filter output and input values from previous timeslices. Thus, a second filter output value is used to acquire the input signal frequency in a second bandwidth.

In the first intermediate period, the digital filtering is typically performed in a first plurality of timeslices using a corresponding first plurality of transient coefficient groups, where each transient coefficient group multiplies stored filter output and input values from a previous timeslice.

For example, the method may accept an input signal with a first frequency and digitally filter the input signal in the first timeslice includes using slow loop base coefficients. Then, the method accepts the input signal with a second frequency (e.g., the input data rate changes) and digitally filters the input signal in the second timeslice includes using fast loop base coefficients. As a result, the input signal second frequency is acquired in a second bandwidth, wider than the first bandwidth.

Additional details of the above-described method, a method for filter response switching, a digital filter for switching applications, and a system for efficient PLL bandwidth switching are provided in more detail below.

DETAILED DESCRIPTION

Figure 1:
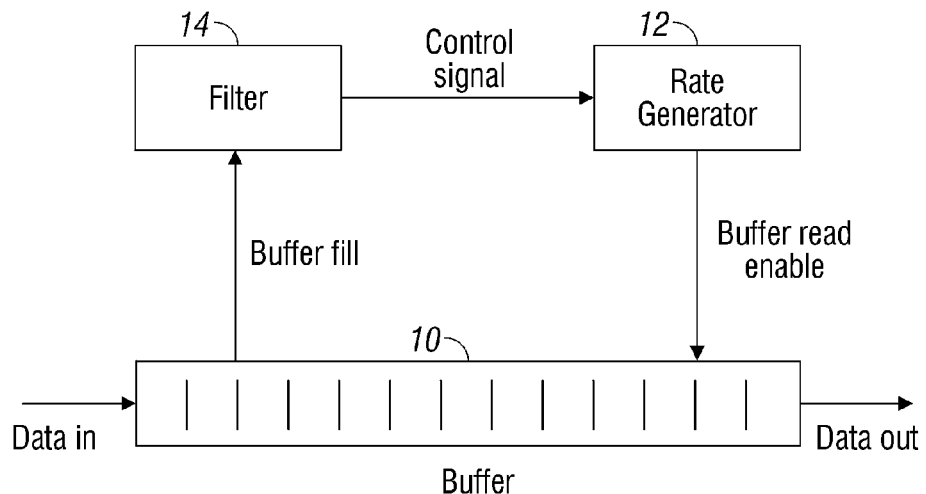
FIG. 1 is a schematic block diagram depicting a phase conditioning circuit used for mapping (prior art).

Various embodiments are now described with reference to the drawings. In the following description, for purposes of explanation, numerous specific details are set forth in order to provide a thorough understanding of one or more aspects. It may be evident, however, that such embodiment(s) may be practiced without these specific details. In other instances, well-known structures and devices are shown in block diagram form in order to facilitate describing these embodiments.

As used in this application, the terms "processor", "processing device", "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Various embodiments will be presented in terms of systems that may include a number of components, modules, and the like. It is to be understood and appreciated that the various systems may include additional components, modules, etc. and/or may not include all of the components, modules etc. discussed in connection with the figures. A combination of these approaches may also be used.

The various illustrative logical blocks, modules, and circuits that have been described may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC. The ASIC may reside in the node, or elsewhere. In the alternative, the processor and the storage medium may reside as discrete components in the node, or elsewhere in an access network.

Figure 4:
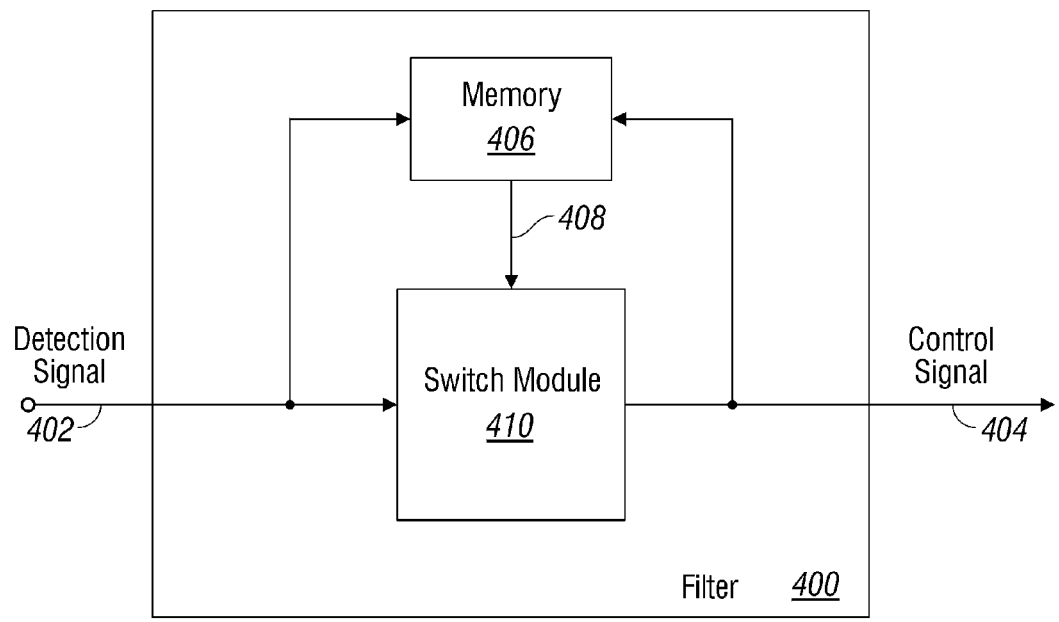
FIG. 4 is a schematic block diagram depicting a digital filter for switching applications.

FIG. 4 is a schematic block diagram depicting a digital filter for switching applications. The filter 400 comprises an input on line 402 to accept a detection signal and an output on line 404 to supply a control signal. A memory 406 has an interface on line 408 for storing and accessing control and detection signal values. Although the memory 406 is shown embedded in the filter 400, it should be understood that the memory may also be located outside (not shown), but accessible by the filter. A switch module 410 multiplies base coefficients by stored control and detection signal values from previous timeslices and to calculate a first steady control signal value in a first timeslice. Examples of a filter transfer function using base coefficients, detection signal values, and control signal values are presented below. A timeslice may be also referred to as a period, clock cycle, portion of a clock cycle, or a plurality of clock cycles.

The switch module 410 multiplies transient coefficients by stored control and detection signal values in a predetermined number of intermediate period timeslices, to calculate the control signal value within a predetermined range. The switch module 410 multiplies base coefficients by stored control and detection signal values in a second timeslice to calculate a second steady control signal value.

The filter of FIG. 4 may be a finite impulse response (FIR) or infinite impulse response (IIR) filter. The FIR filter is finite in the sense that it uses a finite number of taps, or stored values, in the transfer function calculation. In contrast, the IIR filter in infinite in the sense that it is enabled using feedback. The present invention is not limited to any particular filter design.

As described in the explanation of FIG. 6, below, the filter of FIG. 4 may be used in a PLL. However, it should be understood that digital filters are used in a number of switching applications, and the present invention filter would be useful in these applications.

Figure 5A:
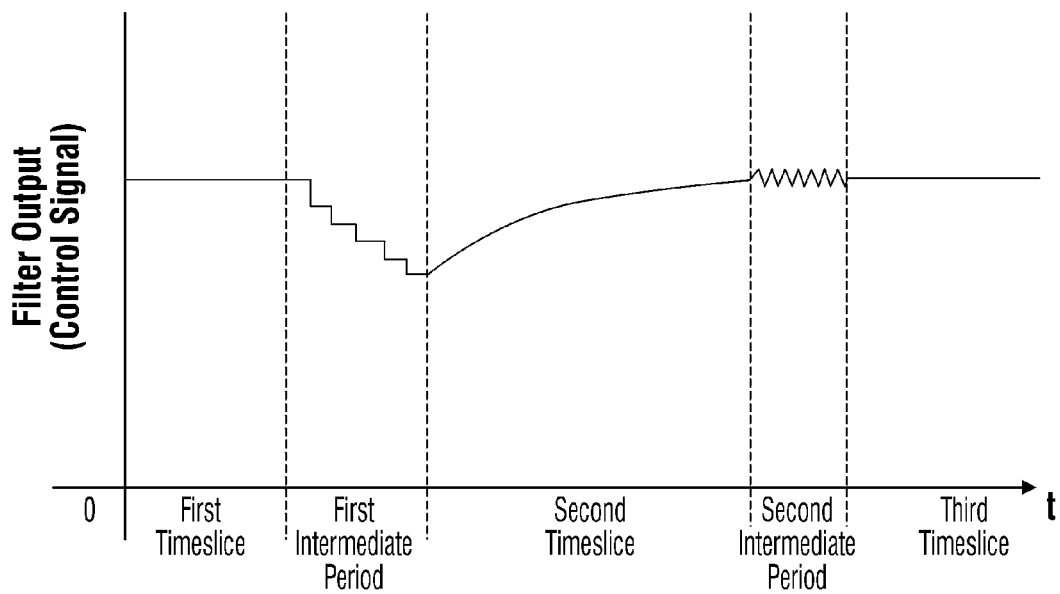
FIGS. 5A and 5B are diagrams depicting examples of the filter control signal as a function of time.
Figure 5B:
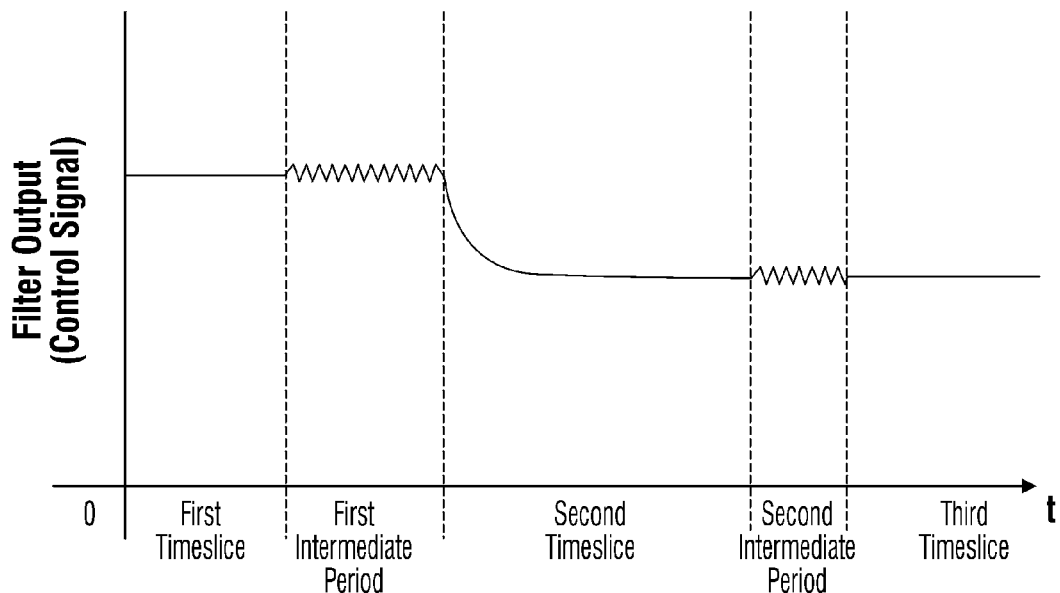

FIGS. 5A and 5B are diagrams depicting examples of the filter control signal as a function of time. The figures show that the time duration between the first and second timeslices is predetermined and fixed. Likewise, the duration of the first intermediate period is predetermined and fixed. The intermediate period is described as comprising a plurality of timeslices. However, it should be understood that there is no prescribed relationship between the temporal durations of the first timeslice, second timeslice, and the intermediate period. In practice however, the intermediate period is advantageously of a very small duration when compared to the first and second timeslice durations. Alternately expressed the durations of the first and second timeslices are not necessary equal to the durations of the timeslices comprising the intermediate period.

FIG. 5A depicts a scenario where the loop undergoes a disruption and recovers. In the first timeslice, the loop is initially locked at a slow bandwidth speed. In the first intermediate period a disruption is detected (e.g., a transient in the input signal frequency), and the loop transitions to a wide bandwidth in the second timeslice. Once the input signal frequency is reacquired, the loop resettles in the second intermediate period, and the loop is acquired in the slow bandwidth in the third timeslice. Note that the transition from the settled state using the fast bandwidth in the second timeslice, to the slow bandwidth state in the third timeslice, which occurs during the second intermediate period, does not result in disruption to the filter output. Therefore, the loop remains locked during the transition.

FIG. 5B depicts a scenario where the loop undergoes a input signal rate change. In the first timeslice, the loop is initially locked at a slow bandwidth speed. In the first intermediate period a disruption is detected (e.g., the input signal frequency changes), and the loop transitions to a wide bandwidth in the second timeslice. Once the input signal frequency is reacquired, the loop resettles in the second intermediate period, and the loop is acquired in the slow bandwidth in the third timeslice. Note that the transition from the settled state using the fast bandwidth in the second timeslice, to the slow bandwidth state in the third timeslice, which occurs during the second intermediate period, does not result in disruption to the filter output. Therefore, the loop remains locked during the transition.

Figure 6:
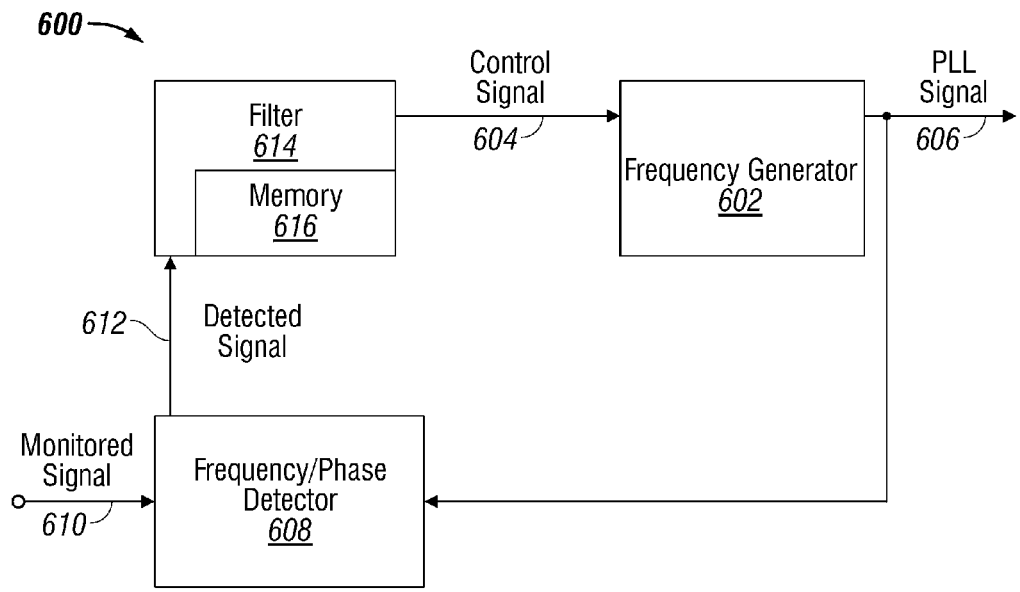
FIG. 6 is a schematic block diagram depicting a phase-locked loop (PLL) system for efficiently switching a loop bandwidth while minimizing control signal transients.

FIG. 6 is a schematic block diagram depicting a phase-locked loop (PLL) system for efficiently switching a loop bandwidth while minimizing control signal transients. The system 600 comprises a frequency generator 602 having an input on line 604 to accept a control signal and an output on line 606 to supply a PLL signal. For example, the frequency generator 602 may be a voltage controlled oscillator (VCO) or a numerical (digital) generator. A frequency/phase detector 608 has an input on line 606 to accept the PLL signal, an input on line 610 to accept a monitored signal, and an output on line 612 to supply a detection signal. Depending on the loop design, the frequency/phase detector 608 may be used to track either frequency or phase. In some aspects (not shown), the PLL signal frequency may be divided prior to being supplied to the frequency/phase detector 608.

A digital filter 614 has a memory 616, an input on line 612 to accept the detection signal in a first timeslice, and an output to supply the control signal on line 604. The control signal enables a PLL first bandwidth, responsive to multiplying base coefficients by control and detection signal values stored in the memory from previous timeslices. In a predetermined number of first intermediate period timeslices, the filter 614 multiplies transient coefficients by control and detection signal values stored in the memory from previous timeslices, in response to changes in the detection signal. In one aspect, the filter uses a first plurality of transient coefficient groups in a corresponding first plurality of intermediate period timeslices, where each transient coefficient group multiplies control and detection signal values stored in the memory from a previous timeslice.

The control signal is maintained within a predetermined range (see FIGS. 5A and 5B). In one aspect, the control signal values in the intermediate periods are maintained in a range between the preceding and subsequent timeslices, when the loop is locked. In the second timeslice, the filter supplies a control signal enabling a PLL second bandwidth responsive to multiplying base coefficients by control and detection signal values stored in the memory from previous timeslices. In one aspect, the filter 614 uses the transient coefficients (in the first intermediate period) to supply the control signal enabling a PLL undefined bandwidth. In this case, the transient coefficients do not define a stable PLL loop. However, their use during only this transitional intermediate timeslice of fixed duration, consisting of a fixed number of clock cycles, does not lead to an unstable loop or undefined loop behavior.

Reconsidering FIG. 5B, in the first timeslice the frequency/phase detector accepts a monitored signal having a first frequency and the PLL signal is likewise at the first frequency. Thus, the filter uses slow loop base coefficients in the first timeslice, as the loop is in a locked or acquired state (the first bandwidth), and the control signal has a first value. Then, the frequency/phase detector accepts a monitored signal having a second frequency. The filter uses fast loop base coefficients in the second timeslice and supplies the control signal, with a second value that enables a PLL second bandwidth, wider than the first bandwidth. In this scenario, the filter uses a slow-to-fast transient coefficient groups in the predetermined number of first intermediate period timeslices.

In a predetermined number of second intermediate period timeslices, the filter multiplies transient coefficients by control and detection signal values stored in the memory from previous timeslices. Then in a third timeslice, the filter multiplies slow loop base coefficients by control and detection signal values stored in the memory from previous timeslices, and supplies the control signal enabling the PLL first bandwidth.

Alternately but not shown, in a second scenario the first bandwidth may represent a wide bandwidth and the second bandwidth a narrow bandwidth. That is, the filter may use fast loop base coefficients in the first timeslice, and slow loop base coefficients in the second timeslice to supply the control signal enabling a second PLL bandwidth, narrower than the first bandwidth. Such a condition may occur, for example, when the system is initially started. In this scenario, the filter uses fast-to-slow transient coefficient groups in the predetermined number of first intermediate period timeslices.

Reconsidering FIG. 5A, the system may switch from a narrow bandwidth to a wide bandwidth as a result of a frequency transient. For example, in the first timeslice the frequency/phase detector accepts a monitored signal with a first frequency and the PLL signal with the first frequency. The loop is locked and the filter uses slow loop base coefficients in the first timeslice. Then, the filter accepts a detection signal with a transient in the first intermediate period and uses fast loop base coefficients in the second timeslice to supply the control signal enabling a second PLL bandwidth, wider than the first bandwidth.

Although the depiction of the system in FIG. 6 implies a combination of connected hardware components, it should be understood that some, or all of the elements of FIG. 6 may be enabled as a result of microprocessor instructions stored in a memory and acted upon by a processor or a logic-coded state machine.

Functional Description

Figure 7:
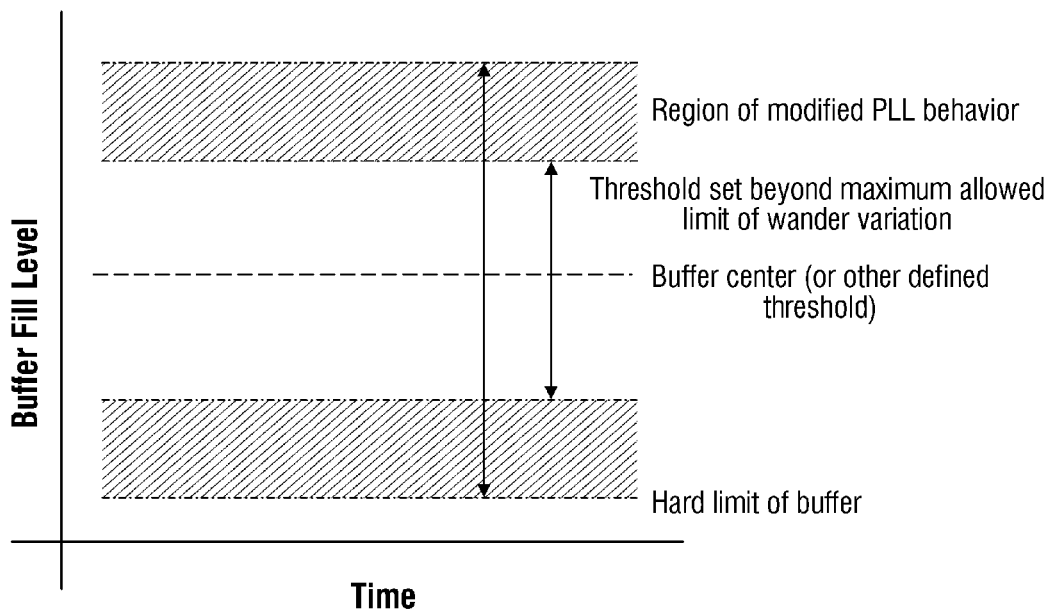
FIG. 7 is a diagram depicting the buffer fill level of a phase conditioning mapper enabled using the bandwidth switching system of FIG. 6.

FIG. 7 is a diagram depicting the buffer fill level of a phase conditioning mapper enabled using the bandwidth switching system of FIG. 6. The buffer fill level provides a mechanism for detecting changes in the incoming rate. The buffer storing the data effectively acts as an error integrator in this system. The fill of the buffer is the integrated instantaneous phase variation between the input and the output. Therefore, by setting a threshold for the buffer fill higher than the wander limit (i.e. at a greater distance from the center-fill of the buffer than the wander limit), it is possible to decide that the variation is caused by a rate change, rather than normal variation in the incoming data rate. As shown, the threshold is set above the normal wander limits of the data rate. When the average buffer fill crosses this threshold (in either the increasing or decreasing directions), a detection signal transient is generated, signifying that the integrated error between the input and output data rates has exceeded the wander limit. This threshold crossing may be the result of a change in the incoming rate, or because the input is no longer a compliant signal. In either case, it is appropriate to change from the normal, low bandwidth state of the PLL to a high-bandwidth state. In the wide bandwidth state, the PLL can either quickly relock to the changed input rate, or respond faster and pass through the illegal variations in the incoming rate.

Figure 8:
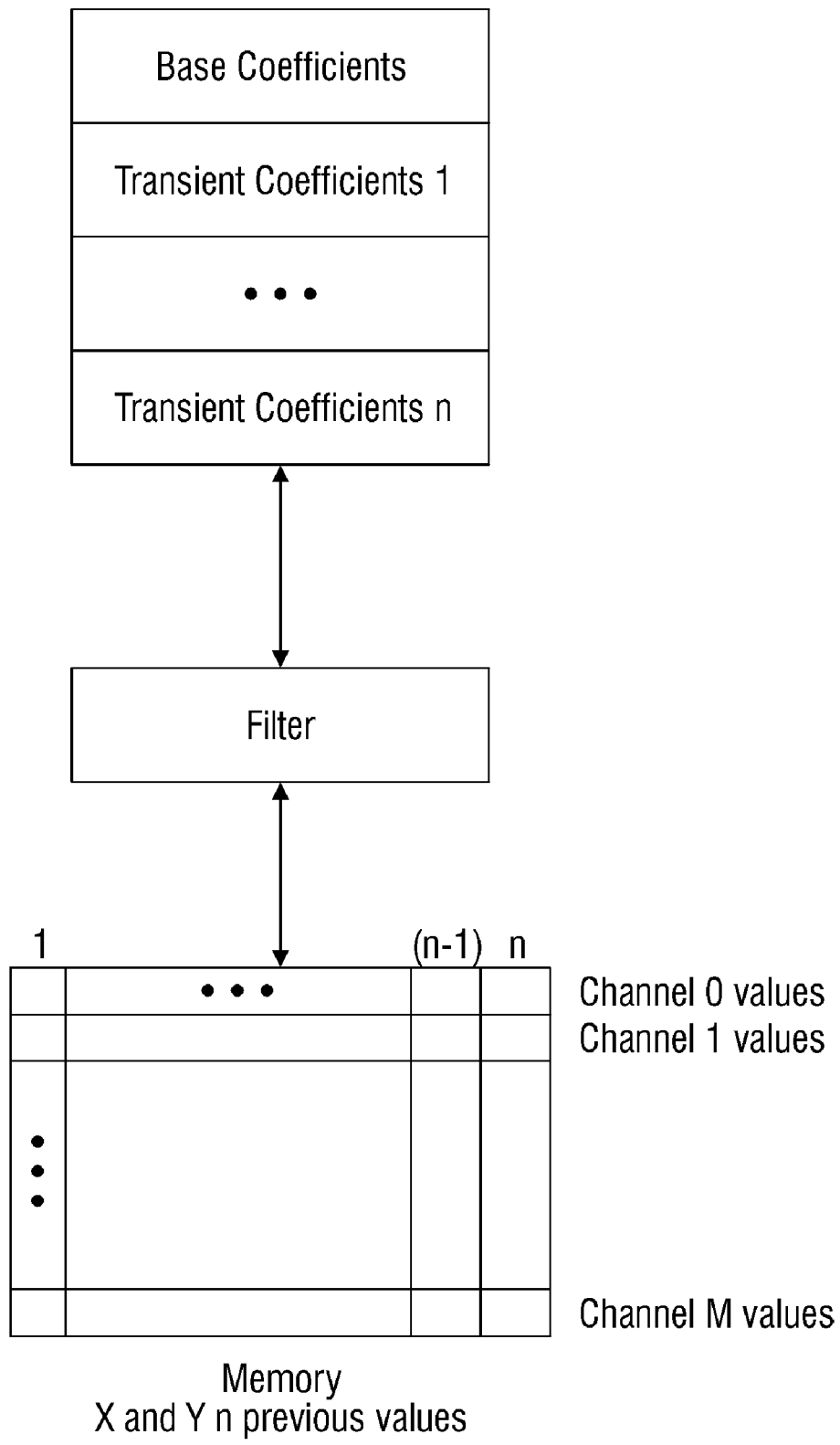
FIG. 8 is a diagram depicting the filter coefficients associated with a multichannel phase conditioning mapper.

FIG. 8 is a diagram depicting the filter coefficients associated with a multichannel phase conditioning mapper. In digital implementations, the loop filter of the PLL is generally implemented as a digital filter. A digital filter is enabled by storing previous incoming (detection) and calculated (control) values in memory. When the bandwidth changes, these stored values are updated in order to maintain the stability and proper operation of the filter. In a high-density, multichannel design, it is advantageous to share the filter in a timesliced way. Thus, previously computed control signals and incoming detection signal values are stored for all channels. A memory is shown coupled to the filter which stores "n" sets of values for each of the M channels, where n depends on the design of the filter. That is, n is equal to the number of predetermined timeslices in an intermediate period. Conventionally, the use of stored values associated with a narrow bandwidth creates large control signal transients when the filter changes from narrow to wide bandwidth base coefficients. Likewise, the use of stored values associated with a narrow bandwidth may result in a period of undefined duration during which the PLL cannot acquire the input signal, when the filter changes from narrow to wide bandwidth base coefficients. The same problem exists when switching from a wide to narrow bandwidth. The control signal transients may result in system errors due to extreme excursions in the output data rate resulting from discontinuous changes in the PLL output, or even a loss of lock.

One conventional solution to the problem is to modify the stored values during the bandwidth transition period, after the new set of base coefficients is switched-in. In such a calculation-intensive design, where many previous incoming and calculated values are stored in memory for each channel, it is a difficult and time consuming task to go into the memory when the bandwidth is switched and modify the stored detection and control signal values. This problem is compounded in a multichannel system. In such a system, in which channels are treated in a timesliced fashion, it is difficult to go in and modify the stored values for only certain channels when the bandwidth has to be changed for those channels.

In the present invention, the filter uses the stored values in memory when changing bandwidths. However, a set of modified (transient) coefficients are used in the intermediate period, instead of the conventional base coefficients. For example, when a channel is found to have lost lock, that channel is treated differently during the next few successive timeslices (the intermediate period), during which time the filter operates on the stored detection/control signal values for that channel using the transient coefficients. These transient coefficients may be stored in memory as shown in FIG. 8.

Figure 9:
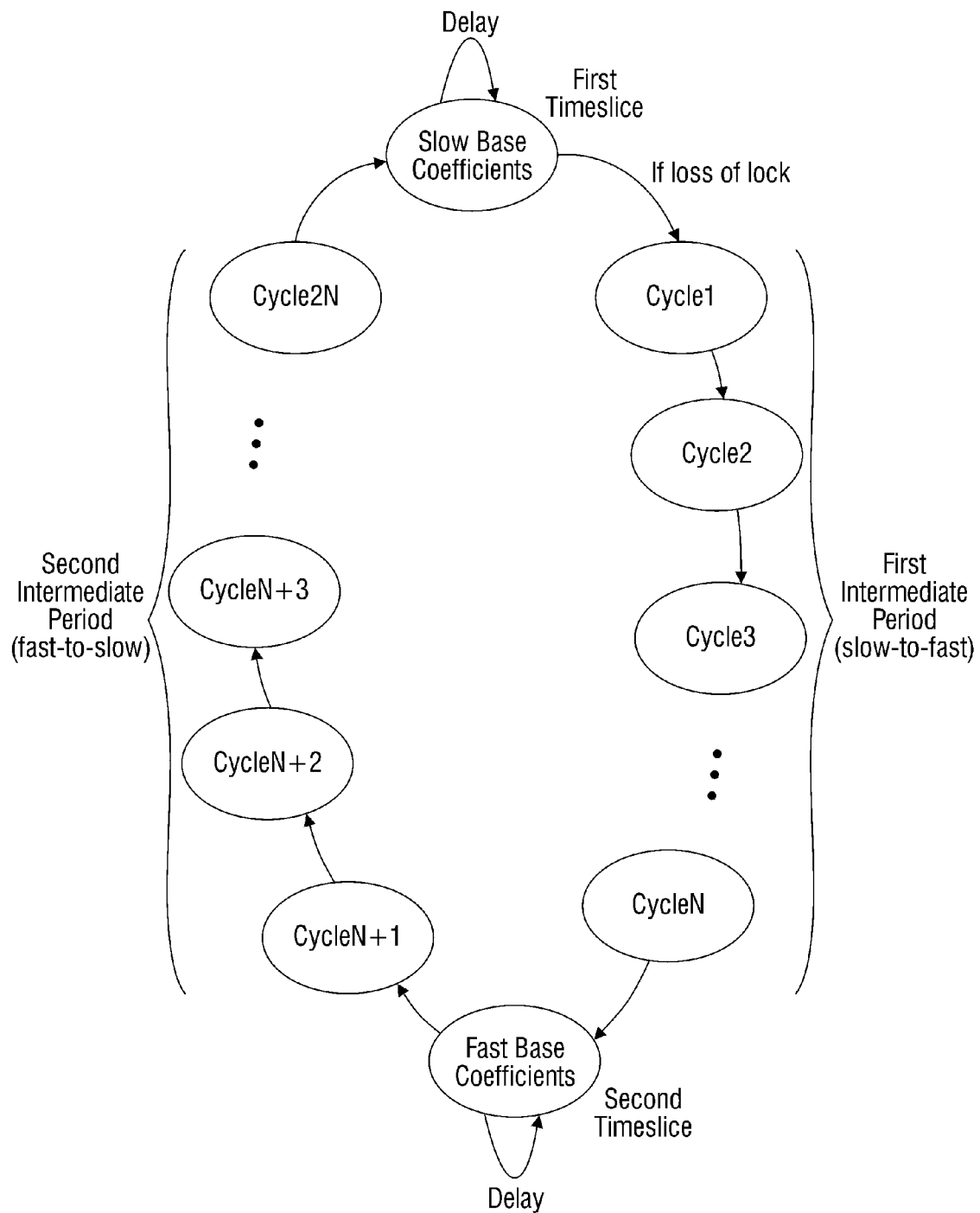
FIG. 9 is a diagram depicting the use of n sets of transient coefficients during the intermediate periods.

FIG. 9 is a diagram depicting the use of n sets of transient coefficients during the intermediate periods. The intermediate period is comprised of successive timeslices, and a new set of (transient) coefficients is used for that channel, until the channel reaches a new bandwidth state. (n) numbers of timeslices are used in transitioning from the nominal locked low bandwidth state to the fast acquisition state.

For example, consider a simple filter using the following coefficients: k, a0, a1, a2, b0, b1, b2. The equation to find the control signal is:

$$a0*Y(j) = \text{sum}(i=0..2)(bi*X(j-i)) + \text{sum}(i=1\ldots2)(ai*Y(j-i))Z(j)=Y(j)*k;$$

where $Z(j)$ is the final filter output (control signal).

To calculate $Y(j)$, stored values of $Y(j)$s are divided by a0. These calculated values of $Y(j)$ are then stored. To get the output $Z(j)$, $Y(j)$ is scaled by k. In this filter implementation, 2 old X values are stored: $Xj-1$ and $Xj-2$, and 2 old Y values are stored: $Yj-1$ and $Yj-2$. With reference to the memory in FIG. 8, n=2 (assuming that the X and Y values are not separately stored).

In one aspect, the above-described formula may be changed to replace k with k1, a base coefficient associated with the narrow loop condition, and k2 for the wide bandwidth condition. For simplicity it may be assumed that k1 is equal to 1. Therefore, the difference between the slow and fast transfer function is the factor of k2. Further suppose that the filter is settled with the original values, so that the X values are close to zero. Also, since the filter is settled, the $Y(j)$ doesn't change much, and the previously stored values are about equal to the new values being stored in each timeslice.

If there is a sudden change in k from 1 to k2, the next calculated $Z(j)$ will be off by approximately a factor of k2, instantaneously. It is possible that a conventional filter would work through this state change and eventually resettle, but the filter control signal output will be significantly disrupted—depending how different k2 is from 1 (k1).

Returning to the present invention filter of FIG. 9, in the first timeslice of the intermediate period (cycle 1), k changes from 1 to k2, a1new=a1/k2, a2new=a2/k2, b1 is the same, and b2 is the same. Now, the calculated $Y(j)$ is scaled down by k2, so the $Z(j)$ will be about the same as before cycle 1, since the calculated $Y(j)$ is scaled up by k2. Thus, there is no sudden change in the control signal $Z(j)$.

In cycle2, a1new changes back to a1 and b1 is the same. This result occurs because a1 multiplies $Y(j-1)$, which was the previous $Y(j)$, which was larger. Since the stored value is larger, a1 need not be made larger in the remainder of the intermediate period.

In cycle3, a2new changes back to a2, and b2 is the same. Now, both stored values of Y, Y(j−1) and Y(j−2) are larger, so a1 and a2 can be brought back to the old values. In this implementation n=3. At the end of 3 cycles, the transfer function uses the original values of a and b, but with a different k. The transition form slow to fast bandwidth is made without a sudden change in Z(j).

Figure 2:
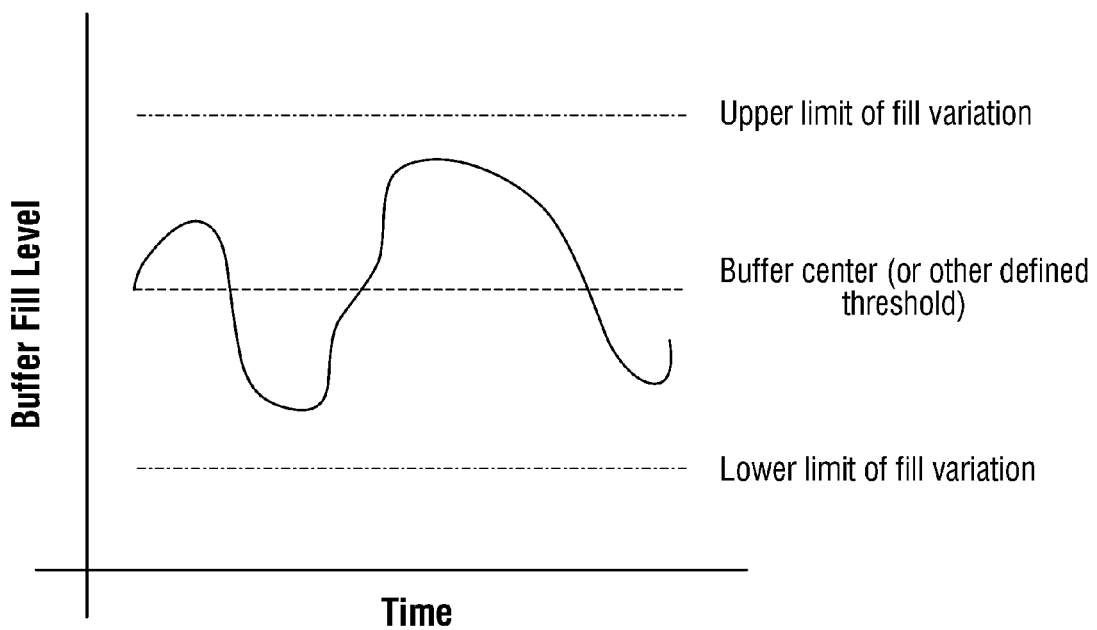
FIG. 2 is a diagram depicting the buffer fill variation as a function of time when the loop is in a locked state (prior art).
Figure 3:
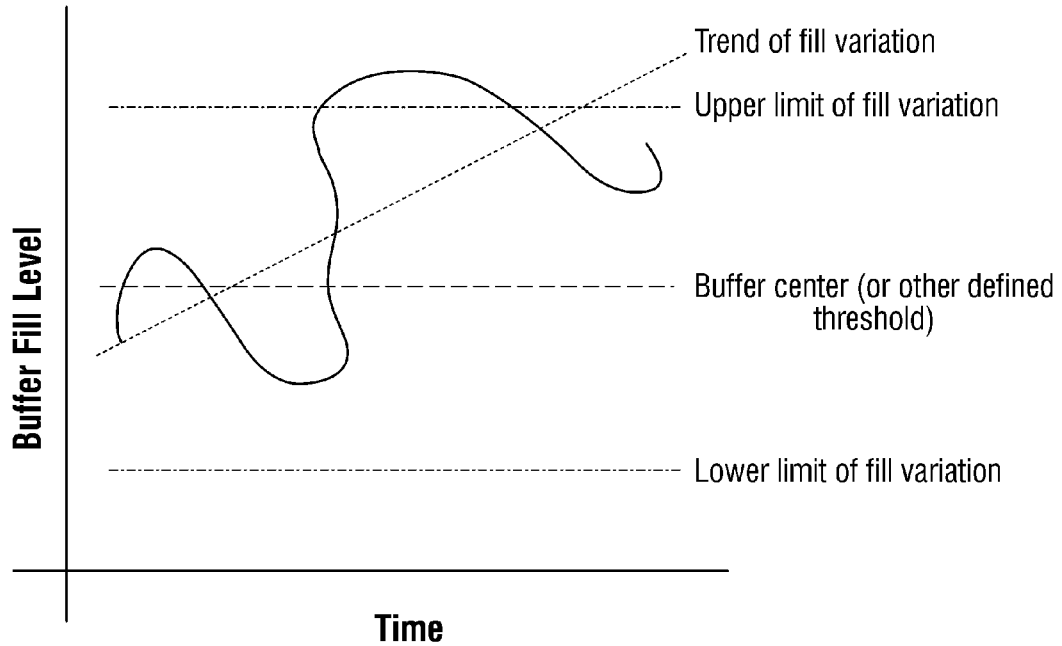
FIG. 3 is a diagram depicting buffer fill as a function of time when there is a change in the incoming data rate (prior art).

In the fast acquisition state, the PLL reacquires the new data rate quickly. A delay can be applied in this state, to prevent the PLL from changing bandwidths for a certain amount of time. During this time, if the rate has indeed changed and the PLL acquires the new rate, and the buffer fill will go back to the center and follow the pattern shown in FIG. 2. If the buffer fill is below the threshold used to decide that the PLL has lost lock (see FIG. 7), and the delay period expires, then the PLL is said to be locked to the new signal. The system then uses another set of transient coefficients in a second intermediate period to return to the low bandwidth state. Note: although n timeslices are shown in both the first and second intermediate periods, the two intermediate periods need not consist of the same number of timeslices. Also, the order of the filter is not necessarily related to the number of transient coefficient sets used in an intermediate period.

Alternately, if the buffer is above the threshold (FIG. 7) after the delay, then either the rate has not been acquired, or the incoming rate is varying too much, in which case the filter continues to stay in the fast state for another delay period. The delay is set such that the PLL should acquire within that time for all legal inputs. If it fails to do so for a certain number of delay periods, a system failure may be declared.

It should be noted that the transient coefficients used in the intermediate periods, going to and from the wide bandwidth state, do not necessarily define a stable filter or bandwidth. In fact, the transient coefficients if used for a long period may result in system instability. However, when the transient coefficients are used together with the previously stored detection signal and control signal values in a short intermediate period consisting of a fixed number of clock cycles, a stable set of control signal transitions result, as the filter goes to the fast state and returns back to the locked state.

Figure 10:
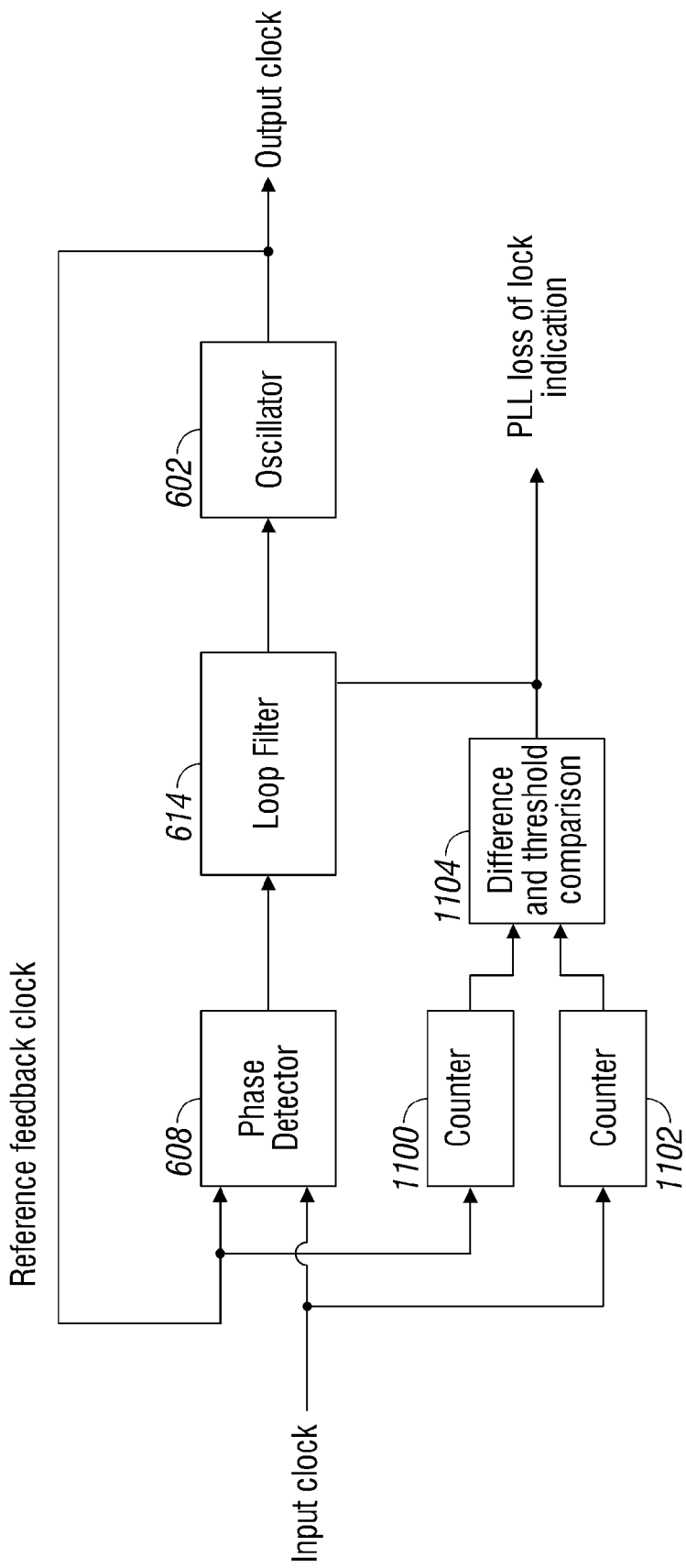
FIG. 10 is a schematic block diagram depicting a mechanism for monitoring a first-in first-out (FIFO) buffer.

FIG. 10 is a schematic block diagram depicting a mechanism for monitoring a first-in first-out (FIFO) buffer. This mechanism can be used to create a rate change decision, to detect a loss of lock in a conventional single channel PLL for non-mapping applications. In addition to driving the phase detector, each clock also drives a separate counter 1100 and 1102. The count value of one counter is subtracted from that of the other, and the absolute value of the difference is monitored by device 1104. If the difference in count exceeds a threshold, it has been determined that the two clocks have drifted sufficiently apart in phase that the PLL has lost lock.

This present invention provides a reliable means of detecting a rate change by monitoring the integrated phase error between input and output fill levels. In addition to the base coefficient set which defines the normal, low bandwidth behavior of the PLL, and/or a corresponding coefficient set which defines a high bandwidth behavior of the PLL, the system uses a set of transient coefficients as a mechanism for adjusting the behavior of the loop filter over successive cycles in an intermediate period. While the transient coefficients may not enable a stable loop, the behavior of the loop in the intermediate period is sufficiently stable to permit rapid input signal acquisition.

Figure 11:
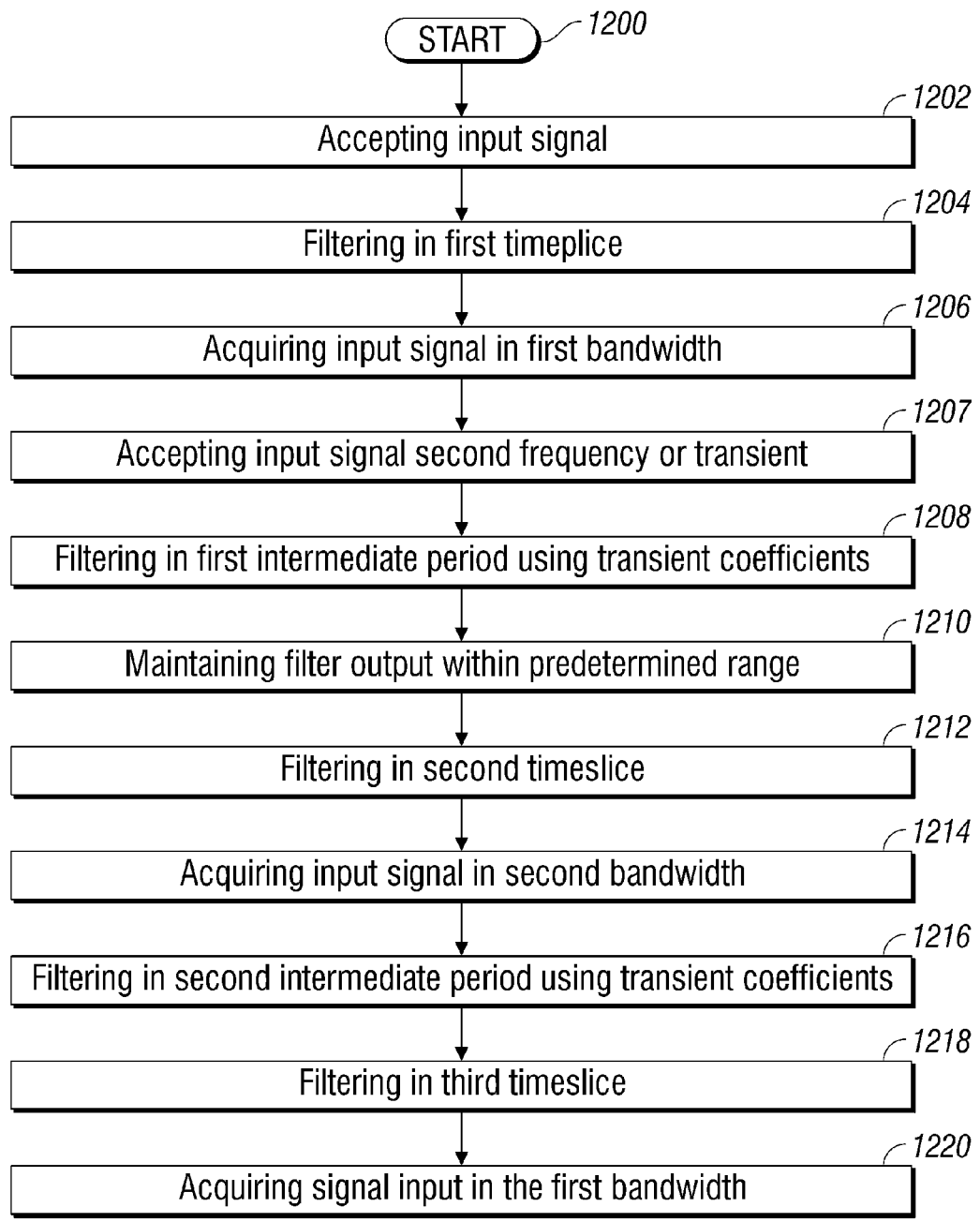
FIG. 11 is a flowchart illustrating a method for efficiently switching a loop bandwidth using stored values in a digital filter of a PLL system.

FIG. 11 is a flowchart illustrating a method for efficiently switching a loop bandwidth using stored values in a digital filter of a PLL system. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1200.

Step 1202 accepts an input signal. In a first timeslice, Step 1204 digitally filters the input signal using base coefficients multiplied by stored filter output and input values from previous timeslices. Using a first filter output value, Step 1206 acquires the input signal frequency in a first bandwidth. In response to changes in the input signal frequency, Step 1208 digitally filters the input signal in a predetermined number of first intermediate period timeslices using transient coefficients multiplied by stored filter output and input values from previous timeslices. Step 1210 maintains the first filter output value within a predetermined range. In a second timeslice, Step 1212 digitally filters the input signal using base coefficients multiplied by stored filter output and input values from previous timeslices. Using a second filter output value, Step 1214 acquires the input signal frequency in a second bandwidth.

In one aspect, digitally filtering the input signal in the predetermined number of first intermediate period timeslices (Step 1208) includes digitally filtering in a first plurality of timeslices using a corresponding first plurality of transient coefficient groups, where each transient coefficient group multiplies stored filter output and input values from a previous timeslice. For example, digitally filtering the input signal in the predetermined number of first intermediate period timeslices includes multiplying a first transient coefficient (cycle 1, see FIG. 9) by stored filter output and input values from the first timeslice.

In one variation, maintaining the first filter output value within the predetermined range in Step 1210 includes tracking the input signal in an undefined bandwidth. In another aspect, the filter output value is maintained within a range defined by the (average) filter output value in the first timeslice, and the (average) filter output value in the second timeslice.

In another aspect, accepting the input signal in Step 1202 includes accepting the input signal with a first frequency, and digitally filtering the input signal in the first timeslice (Step 1204) includes using slow loop base coefficients. If Step 1207 accepts the input signal with a second frequency, then digitally filtering the input signal in the second timeslice (Step 1212) includes using fast loop base coefficients and acquiring the input signal frequency in the second bandwidth (Step 1214) includes acquiring the input signal second frequency in the second bandwidth, wider than the first bandwidth. In this variation, digitally filtering the input signal in the predetermined number of first intermediate period timeslices (Step 1210) includes digitally filtering using a slow-to-fast transient coefficient group.

In a related aspect, Step 1216 digitally filters the input signal in a predetermined number of second intermediate period timeslices using transient coefficients multiplied by stored filter output and input values from previous timeslices. In a third timeslice, Step 1218 digitally filters the input signal using the slow loop base coefficients multiplied by stored filter output and input values from previous timeslices. Step 1220 acquires the input signal second frequency in the first bandwidth.

In a different aspect, digitally filtering the input signal in the first timeslice (Step 1204) includes using fast loop base coefficients and digitally filtering the input signal in the second timeslice (Step 1212) includes using slow loop base coefficients. Then, acquiring the input signal frequency in the second bandwidth in Step 1214 includes acquiring the input signal frequency in the second bandwidth, narrower than the first bandwidth. In this variation, digitally filtering the input signal in the predetermined number of first intermediate period timeslices (Step 1210) includes digitally filtering using a fast-to-slow transient coefficient group.

In another aspect, accepting the input signal in Step 1202 includes accepting the input signal with a first frequency, and digitally filtering the input signal in the first timeslice (Step 1204) includes using slow loop base coefficients. Then, Step 1207 accepts an input signal with a frequency transient, Step 1212 digitally filters the input signal in the second timeslice using fast loop base coefficients, and Step 1214 acquires the input signal frequency in a second bandwidth, wider than the first bandwidth.

Figure 12:
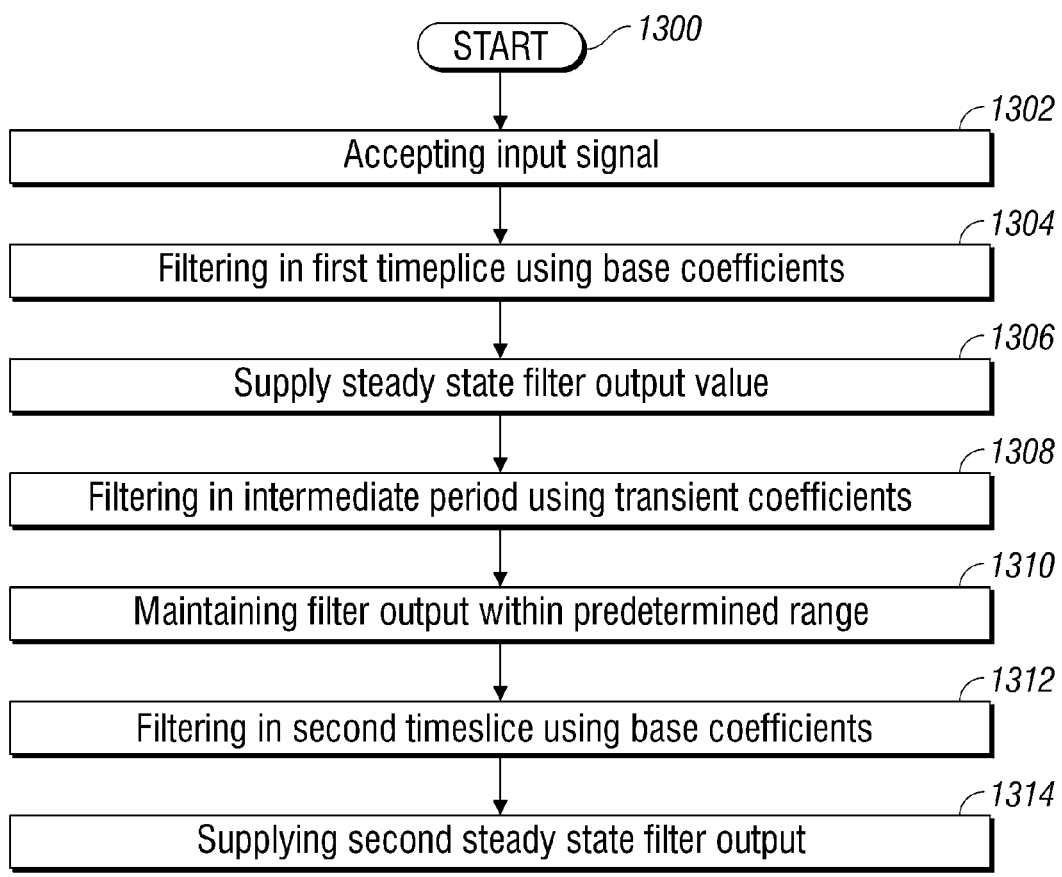
FIG. 12 is a flowchart illustrating a method for efficiently switching digital filter coefficients.

FIG. 12 is a flowchart illustrating a method for efficiently switching digital filter coefficients. The method starts at Step 1300. Step 1302 accepts an input signal. In a first timeslice, Step 1304 digitally filters the input signal using base coefficients multiplied by stored filter output and input values from previous timeslices. Step 1306 supplies a first steady state filter output value. In response to changes in the input signal, Step 1308 digitally filters the input signal in a predetermined number of intermediate period timeslices using transient coefficients multiplied by stored filter output and input values from previous timeslices. Step 1310 maintains the first filter output value within a predetermined range. In a second timeslice, Step 1312 digitally filters the input signal using base coefficients multiplied by stored filter output and input values from previous timeslices. Step 1314 supplies a second steady state filter output value.

A system and method have been provided for efficiently switching a digital filter response. Although examples of a PLL and phase conditioning mapper have been given to illustrate the invention, the invention is not necessarily limited to these examples. Other variations and embodiments of the invention will occur to those skilled in the art.

We claim:

1. In a phase-locked loop (PLL) system, a method for efficiently switching a loop bandwidth using stored values in a digital filter, the method comprising:
   accepting an input signal;
   in a first timeslice, digitally filtering the input signal using base coefficients multiplied by stored filter output and input values from previous timeslices;
   using a first filter output value, acquiring the input signal frequency in a first bandwidth;
   in response to changes in the input signal frequency, digitally filtering the input signal in a predetermined number of first intermediate period timeslices using transient coefficients multiplied by number stored filter output and input values from previous timeslices;
   maintaining the first filter output value within a predetermined range;
   in a second timeslice, digitally filtering the input signal using said base coefficients multiplied by stored filter output and input values from previous timeslices; and,
   using a second filter output value, acquiring the input signal frequency in a second bandwidth.

2. The method of claim 1 wherein maintaining the first filter output value within the predetermined range includes tracking the input signal in an undefined bandwidth.

3. The method of claim 1 wherein digitally filtering the input signal in the predetermined number of first intermediate period timeslices includes digitally filtering in a first plurality of timeslices using a corresponding first plurality of transient coefficient groups, each transient coefficient group multiplying stored filter output and input values from a previous timeslice.

4. The method of claim 3 wherein digitally filtering the input signal in the predetermined number of first intermediate period timeslices includes digitally filtering using a slow-to-fast transient coefficient group.

5. The method of claim 1 wherein accepting the input signal includes accepting the input signal with a first frequency;
   wherein digitally filtering the input signal in the first timeslice includes using slow loop base coefficients;
   the method further comprising:
   accepting the input signal with a second frequency;
   wherein digitally filtering the input signal in the second timeslice includes using fast loop base coefficients; and,
   wherein acquiring the input signal frequency in the second bandwidth includes acquiring the input signal second frequency in the second bandwidth, wider than the first bandwidth.

6. The method of claim 5 further comprising:
   digitally filtering the input signal in a predetermined number of second intermediate period timeslices using transient coefficients multiplied by stored filter output and input values from previous timeslices;
   in a third timeslice, digitally filtering the input signal using the slow loop base coefficients multiplied by stored filter output and input values from previous timeslices; and,
   acquiring the input signal second frequency in the first bandwidth.

7. The method of claim 1 wherein digitally filtering the input signal in the first timeslice includes using fast loop base coefficients;
   wherein digitally filtering the input signal in the second timeslice includes using slow loop base coefficients; and,
   wherein acquiring the input signal frequency in the second bandwidth includes acquiring the input signal frequency in the second bandwidth, narrower than the first bandwidth.

8. The method of claim 7 wherein digitally filtering the input signal in the predetermined number of first intermediate period timeslices includes digitally filtering using a fast-to-slow transient coefficient group.

9. The method of claim 1 wherein accepting die input signal includes accepting the input signal with a first frequency;
   wherein digitally filtering the input signal in the first timeslice includes using slow loop base coefficients;
   the method further comprising:
   accepting the input signal with a frequency transient;
   wherein digitally filtering the input signal in the second timeslice includes using fast loop base coefficients; and,
   wherein acquiring the input signal frequency in the second bandwidth includes acquiring the input signal first frequency in the second bandwidth, wider than the first bandwidth.

10. The method of claim 1 wherein digitally filtering the input signal in the predetermined number of first intermediate period timeslices includes multiplying a first transient coefficient by stored filter output and input values from the first timeslice.

11. A method for efficiently switching digital filter coefficients, the method comprising:
    accepting an input signal;

in a first timeslice, digitally filtering the input signal using base coefficients multiplied by stored filter output and input values from previous timeslices;

supplying a first steady state filter output value;

in response to changes in the input signal, digitally filtering the input signal in a predetermined number of intermediate period timeslices using transient coefficients multiplied by stored filter output and input values from previous timeslices;

maintaining the first filter output value within a predetermined range;

in a second timeslice, digitally filtering the input signal using said base coefficients multiplied by stored filter output and input values from previous timeslices; and, supplying a second steady state filter output value.

12. A phase-locked loop (PLL) system for efficiently switching a loop bandwidth while minimizing control signal transients, the system comprising:

a frequency generator having an input to accept a control signal and an output to supply a PLL signal;

a frequency/phase detector having an input to accept the PLL signal, an input to accept a monitored signal, and an output to supply a detection signal;

a digital filter having a memory, an input to accept the detection signal in a first timeslice, and an output to supply the control signal enabling a PLL first bandwidth, responsive to multiplying base coefficients by control and detection signal values stored in the memory from previous timeslices;

wherein the filter multiplies transient coefficients by control and detection signal values stored in the memory from previous timeslices, in a corresponding predetermined number of first intermediate period timeslices, in response to changes in the detection signal, and maintains the control signal within a predetermined range; and, wherein the filter supplies the control signal in a second timeslice, enabling a PLL a second bandwidth responsive to multiplying said base coefficients by control and detection signal values stored in the memory from previous timeslices.

13. The system of claim 12 wherein the filter uses the transient coefficients to supply the control signal enabling a PLL undefined bandwidth.

14. The system of claim 12 wherein the filter uses a first plurality of transient coefficient groups in the corresponding first plurality of intermediate period timeslices, each transient coefficient group multiplying control and detection signal values stored in the memory from a previous timeslice.

15. The system of claim 12 wherein the frequency/phase detector accepts the monitored signal having a first frequency and the PLL signal having the first frequency in the first timeslice;

wherein the filter uses slow loop base coefficients in the first timeslice;

wherein the frequency/phase detector accepts the monitored signal having a second frequency;

wherein the filter uses fast loop base coefficients in the second timeslice and supplies the control signal enabling a PLL second bandwidth, wider than the first bandwidth.

16. The system of claim 15 wherein the filter uses a slow-to-fast transient coefficient groups in the predetermined number of first intermediate period timeslices.

17. The system of claim 15 wherein the filter multiplies transient coefficients by control and detection signal values stored in the memory from previous timeslices in a predetermined number of second intermediate period timeslices; and, wherein the filter, in a third timeslice, multiplies slow loop base coefficients by control and detection signal values stored in the memory from previous timeslices, and supplies the control signal enabling the PLL first bandwidth.

18. The system of claim 12 wherein the filter uses fast loop base coefficients in the first timeslice, and slow loop base coefficients in the second timeslice to supply the control signal enabling a second PLL bandwidth, narrower than the first bandwidth.

19. The system of claim 18 wherein the filter uses fast-to-slow transient coefficient groups in the predetermined number of first intermediate period timeslices.

20. The system of claim 12 wherein the frequency/phase detector, in the first timeslice, accepts the monitored signal with a first frequency and the PLL signal with the first frequency;

wherein the filter uses slow loop base coefficients in the first timeslice;

wherein the filter accepts the detection signal with a transient in the first intermediate period; and, wherein the filter uses fast loop base coefficients in the second timeslice to supply the control signal enabling a second PLL bandwidth, wider than the first bandwidth.

21. A digital filter for switching applications, the filter comprising:

an input to accept a detection signal;

an output to supply a control signal;

a memory with an interface for storing and accessing control and detection signal values;

a switch module to multiply base coefficients by stored control and detection signal values from previous timeslices and to calculate a first steady control signal value in a first timeslice;

wherein the switch module multiplies transient coefficients by stored control and detection signal values, in a corresponding predetermined number of intermediate period timeslices, to calculate the control signal value within a predetermined range; and, wherein the switch module multiplies said base coefficients by stored control and detection signal values in a second timeslice to calculate a second steady control signal value.

* * * * *